(12) United States Patent
Marshall (10) Patent No.: US 6,468,909 B1
(45) Date of Patent: *Oct. 22, 2002

(54) ISOLATION AND/OR REMOVAL OF IONIC CONTAMINANTS FROM PLANARIZATION FLUID COMPOSITIONS USING MACROCYCLIC POLYETHERS AND METHODS OF USING SUCH COMPOSITIONS

(75) Inventor: Brian K. Marshall, Boise, ID (US)

(73) Assignee: Micron Technology, Inc., Boise, ID (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/146,299

(22) Filed: Sep. 3, 1998

(51) Int. Cl.[7] .............................................. H01L 21/302
(52) U.S. Cl. ........................ 438/691; 438/692; 438/693; 438/694; 438/700
(58) Field of Search ................................ 438/693, 427, 438/421, 692, 694, 745, 747, 754, 700, 691; 134/3

(56) References Cited

U.S. PATENT DOCUMENTS

| | | | |
|---|---|---|---|
| 4,193,226 A | * 3/1980 | Gill, Jr. et al. | 451/276 |
| 4,271,425 A | * 6/1981 | Wong | 525/474 |
| 4,811,522 A | * 3/1989 | Gill, Jr. | 451/285 |
| 4,963,283 A | 10/1990 | Lapham et al. | 252/79.3 |
| 4,997,970 A | * 3/1991 | Ager, Jr. | 558/354 |
| 5,051,134 A | * 9/1991 | Schnegg et al. | 134/3 |
| 5,094,972 A | * 3/1992 | Pierce et al. | 438/427 |
| 5,104,421 A | * 4/1992 | Takizawa et al. | 51/295 |
| 5,286,887 A | * 2/1994 | Traylor et al. | 556/1 |
| 5,290,361 A | 3/1994 | Hayashida et al. | 134/2 |

(List continued on next page.)

FOREIGN PATENT DOCUMENTS

| | | |
|---|---|---|
| DE | 3939661 | 6/1991 |
| JP | 32566665 | 11/1991 |

OTHER PUBLICATIONS

Hiemenz, "The Critical Flocculation Concentration and the Schulze–Hardy Rule," *Principles of Colloid and Surface Chemistry*, Second ed., 717–722.*
Ebbing, Darrel, General Chemistry 3rd ed, p. 460, 1990.*
London, Marc, Organic Chemistry 3rd ed, pp. 358–359, 1995.*
Achuthan et al., "Uniformity of Removal Rate in the CMP of Silicon Dioxide Films," *DUMIC Conference*, 177–179 (1995).

(List continued on next page.)

Primary Examiner—Benjamin L. Utech
Assistant Examiner—Binh X. Tran
(74) Attorney, Agent, or Firm—Mueting, Raasch & Gebhardt, P.A.

(57) ABSTRACT

The present invention provides fluid compositions for use in the planarization of a substrate surface. Fluid compositions include a planarization slurry having an abrasive component and a chemically interactive component and an effective amount of at least one crown ether that is capable of isolating at least one charged ion contaminant specie in the planarization slurry. Also included are fluid compositions that are pre-treated with an effective amount of at least one crown ether to remove one or more charged ion contaminants in the fluid composition utilized in a planarization process. Methods of using the fluid compositions are also provided.

37 Claims, 3 Drawing Sheets

U.S. PATENT DOCUMENTS

| | | | |
|---|---|---|---|
| 5,366,542 A | | 11/1994 | Yamada et al. ................. 106/3 |
| 5,391,258 A | | 2/1995 | Brancaleoni et al. .......... 216/89 |
| 5,393,892 A | * | 2/1995 | Krakowiak et al. .......... 549/214 |
| 5,421,769 A | | 6/1995 | Schultz et al. ............... 451/287 |
| 5,476,606 A | | 12/1995 | Brancaleoni et al. ....... 252/79.1 |
| 5,480,476 A | | 1/1996 | Cook et al. ..................... 106/3 |
| 5,498,293 A | * | 3/1996 | Ilardi et al. ..................... 134/3 |
| 5,525,191 A | * | 6/1996 | Manair et al. ............... 438/693 |
| 5,527,423 A | * | 6/1996 | Neville et al. ............... 438/693 |
| 5,547,760 A | * | 8/1996 | Tarbet et al. ................ 428/421 |
| 5,618,433 A | * | 4/1997 | Tarbet et al. ................ 428/421 |
| 5,730,874 A | * | 3/1998 | Wai et al. .................... 210/638 |
| 5,734,192 A | * | 3/1998 | Sengle et al. ................ 251/506 |
| 5,759,917 A | | 6/1998 | Grover et al. ............... 438/690 |
| 5,827,781 A | | 10/1998 | Skrovan et al. ............. 438/692 |
| 5,858,813 A | | 1/1999 | Scherber et al. ............ 438/693 |
| 5,861,054 A | | 1/1999 | Miyashita et al. .............. 106/3 |
| 5,876,490 A | | 3/1999 | Ronay ............................ 106/3 |
| 5,904,159 A | | 5/1999 | Kato et al. |
| 5,916,819 A | | 6/1999 | Skrovan et al. ............. 438/692 |
| 5,981,454 A | | 11/1999 | Small |
| 6,030,491 A | | 2/2000 | Vaarstra ........................ 216/79 |
| 6,060,395 A | | 5/2000 | Skrovan et al. ............. 438/692 |
| 6,095,161 A | | 8/2000 | Vaarstra |
| 6,099,604 A | | 8/2000 | Sandhu et al. |
| 6,117,783 A | | 9/2000 | Small et al. |
| 6,136,218 A | | 10/2000 | Skrovan et al. ............ 252/79.1 |
| 6,207,630 B1 | | 3/2001 | Vaartstra ..................... 510/175 |
| 6,280,924 B1 | | 8/2001 | Skrovan et al. ............. 430/692 |
| 2001/0014539 A1 | | 8/2001 | Skrovan et al. ............. 238/697 |

OTHER PUBLICATIONS

Akiya et al., "Thin–Oxide Dielectric Strength Improvement by Adding a Phosphonic Acid Chelating Agent into $NH_4OH$–$H_2O_2$ Solution," *J. Electrochem. Soc.*, 141(10):L139–L142 (1994).

Ernsberger, "Attack of Glass by Chelating Agents," *J. American Ceramic Society*, 42(8):373–375 (1959).

Fang et al., "Determination of the Composition of Viscous Liquid Film on Electropolishing Copper Surface by XPS and AES," *J. Electrochem. Soc.*, 136(12):3800–3803 (1989).

* cited by examiner

ISOLATION AND/OR REMOVAL OF IONIC CONTAMINANTS FROM PLANARIZATION FLUID COMPOSITIONS USING MACROCYCLIC POLYETHERS AND METHODS OF USING SUCH COMPOSITIONS

FIELD OF THE INVENTION

The present invention is directed to the isolation of ionic contaminants in planarization fluid compositions and/or removal of ionic contaminants, such as metallic cations, from planarization fluid compositions, e.g., slurries, and methods for using such compositions. More particularly, the present invention is directed to planarization fluid compositions exposed to, i.e., pre-treated, or containing one or more macrocyclic polyethers or "crown" ethers that selectively chelate ions of a specific size.

BACKGROUND OF THE INVENTION

A large fraction of yield losses in wafer fabrication or processing of semiconductor devices is attributed to contamination. Contaminants can be organic or inorganic particles, films or molecular compounds, ionic materials or atomic species. Examples of ionic contaminants are sodium, potassium, lithium, calcium, boron, manganese, sodium, titanium, zirconium, aluminum, sulfur and magnesium. Other damaging elemental impurities include heavy metals, for example, such as iron, copper, nickel and gold.

Particularly problematic, however, are analytes, such as high valence metallic ions, e.g., zirconium ($Zr^{+4}$), found in planarization fluid compositions and used during planarization of wafers. Although such fluid compositions are generally quite pure, they are, however, not free of contaminants such as the ionic contaminants listed above. These analytes can destabilize a planarization composition in even minute concentrations (ppm or ppb level). The destabilization of the slurry from the presence of these analytes can result in aggregate particles having sufficient size and mass to cause wafer defects, e.g., scratches.

During planarization, typically a rotating substrate of semiconductor material is held against a wetted planarization or polishing surface using a liquid slurry (e.g., a colloidal suspension of abrasive particles) under controlled pressure and temperature conditions. The fluid typically includes an abrasive component, such as alumina, silica, or similar particulates, although, alternatively, a pad could include the abrasive component. During planarization, abrasive particles and contaminants such as high valence ions are generally present at the surface of the substrate being planarized.

Planarization is used to produce a surface with a desired thickness and/or uniformity. However, typical slurries used in the planarization process contain certain levels of metal ions, particularly high valence metal ions. Further, such metal ions, particularly high valence metal ions, destabilize the colloidal suspension of abrasive particles leading to aggregation of such abrasive particles. Such aggregation leads to wafer detects, e.g., scratches, during the planarization of wafers.

The presence of such metal contaminants during wafer processing has become particularly problematic in high density, integrated circuit technology. For example, wafer defects caused by contaminants can cause a device to fail because of improperly defined patterns caused by the defects, by creating unpredictable surface topography, by inducing leakage currents through insulating layers, or by accelerating device wearout.

It has been reported that certain chelating agents have been added to cleaning solutions commonly used to remove particles and organic contaminants on silicon surfaces. Such chelating agents tend to reduce certain metallic contamination deposition on a silicon wafer. However, such wet cleaning procedures are performed after CMP processing and ion contamination and wafer defects such as caused by abrasive particle aggregation may have already caused significant problems to the wafer during the planarization process.

Also, it has been demonstrated that water soluble multidentate chelating agents, particularly water soluble bidentate ionic chelating agents, such as 1,2-ethylenediphosphonic acid (EDP), can be used during planarization processing to remove metal ion contaminants, as disclosed in U.S. patent application Ser. No. 08/682,308, filed on Jul. 17, 1996, entitled "A Planarization Fluid Composition Including Chelating Agents and Planarization Method Using Same."

Thus, improvements in the fluid compositions employed in planarization processes are needed to reduce wafer defects. The present invention, as described below, provides such improvements and overcomes the problems described above and those problems that will become apparent to one skilled in the art from the detailed description below.

SUMMARY OF THE INVENTION

The present invention provides fluid compositions for use in the planarization of a substrate surface, such as a wafer. The fluid compositions include a planarization slurry that has an abrasive component and a chemically interactive component that interacts with the surface of the wafer during planarization. The fluid compositions also include an effective amount of at least one crown ether that is capable of isolating at least one charged ion contaminant specie in the planarization slurry.

Charged ion contaminant species that can be isolated using the fluid compositions of the invention include, but are not limited to, ions having valences of +2, +3, +4 or more. Preferably, the charged ion contaminant is a $Zr^{+4}$ ion. Typically, the crown ethers employed in the invention to isolate one or more charged ion contaminants are of the formula benzo or dibenzo-3n-crown-n, where n is a positive whole integer. However, other crown ethers known in the art are also useful in the invention.

Preferably, the fluid composition employed to planarize the surface of a wafer, contains a planarization slurry that has an abrasive component and a chemically interactive component and an effective amount of at least one crown ether, such as dibenzo-14-crown-4 ether, benzo-15-crown-5 ether, dibenzo-18-crown-6 ether or benzo-21-crown-7 ether or a combination thereof. The crown ether or combination thereof is utilized to isolate at least one ion contaminant specie in the planarization slurry.

A planarization method of the present invention includes providing a wafer and a pad that has contact with the wafer surface, then planarizing the wafer surface using the pad and a fluid composition. The fluid composition contains a planarization slurry that has an abrasive component, a chemically interactive component, and an effective amount of at least one crown ether that is capable of isolating at least one charged ion contaminant specie in the planarization slurry.

The fluid composition used in the planarization method is capable of removing or isolating charged ion contaminant species and include, but are not limited to, ions having valences of +2, +3, +4 or more. Preferably, the charged ion contaminant is a $Zr^{+4}$ ion. Typically, the crown ethers employed in the method can isolate and/or remove one or more charged ion contaminants and are of the formula benzo or dibenzo-3n-crown-n, where n is a positive whole integer. However, other crown ethers known in the art are also useful in the method.

Also provided, is a method for removing charged ion contaminant species from a planarization slurry, and includes combining an aqueous planarization slurry with at least one crown ether in an organic solvent to form a mixture. At least one charged ion contaminant specie can then be isolated from the slurry by separating the organic solvent layer from the aqueous layer to yield a planarization slurry that has a reduced concentration of the at least one charged ion contaminant specie.

The present invention also provides an isolation method. The method includes forming a shallow trench isolation structure that has an oxide surface and a planarization stop layer formed of silicon nitride. The oxide surface is planarized using a fluid composition that contains a planarization slurry that has an abrasive component and a chemically interactive component. The fluid composition also contains an effective amount of at least one crown ether that is capable of isolating at least one charged ion contaminant specie.

In a preferred isolation method, the fluid composition, which contains an abrasive component and a chemically interactive component, has a $Zr^{+4}$ content of less than 1 ppm, and the planarization process is effectively stopped on a stop layer formed of silicon nitride.

DETAILED DESCRIPTION

The present invention is directed to the selective isolation of contaminating analytes, such as high valence ions, in planarization fluid compositions, e.g., mechanical polishing or planarization slurries, and/or removal of such contaminating analytes form such planarization fluid compositions. The fluid compositions are used in wafer planarization processes. For example, a surface of a structure formed during shallow trench isolation (STI) may be planarized using such a composition. The present invention further provides methods of planarization wherein the planarization composition used in a planarization process has a reduced level of charged ion contaminants, and in particular, high valence charged metal ions such as zirconium ($Zr^{+4}$).

Definitions

As used herein, an "effective amount" of a crown ether is a quantity capable of isolating one or more particular types of contaminating charged ions in a composition employed in a planarization method or process and/or reducing the concentration of or removing one or more particular type of contaminating charged ions, such as metal ions, from a composition employed in a planarization method or process.

As used herein, the term "essentially free" is meant to indicate that solvents and/or organic or aqueous layers, i.e., an organic layer comprising a crown ether, employed in preparing fluid planarization compositions or slurries of the invention, have less than 20% contaminating ionic species present in the solvent or layer, preferably less than 10%, and most preferably less than 5% when compared to a non-treated solvent or layer. The term also refers to a treated planarization composition or slurry of the invention, i.e., treated by exposure to one or more crown ethers, that has less than 20% contaminating ionic species present in the composition or slurry, preferably less than 10%, and most preferably less than 5% when compared to a non-treated slurry.

It is further to be understood that the term "planarization" as used herein is meant to encompass a wide variety of planarization techniques, as well known to one skilled in the art, whereby planarization of a surface is accomplished through mechanical abrasion thereof. Planarization may encompass a chemically active component, such as in, for example, chemical mechanical planarization (CMP). Planarization and polishing are described generally herein as planarization, as both terms are meant to encompass mechanical abrasion of the surface, even though polishing typically refers to less abrasion than planarization.

As used in this application, "substrate assembly" refers to either a semiconductor substrate such as the base semiconductor layer, e.g., the lowest layer of silicon material in a wafer, or a silicon layer deposited on another material, such as silicon on sapphire, or a semiconductor substrate having one or more layers or structures formed thereon or regions formed therein. When reference is made to a substrate assembly in the following description, various process steps may have been previously used to form or define regions, junctions, various structures or features, and openings such as vias, contact openings, high aspect ratio openings, etc.

Planarization Fluid Compositions

Planarization fluid compositions, e.g., slurries, of the present invention can be used to reduce the effect of charged ion contaminant species, for example, metal and metalloid ions, on abrasive components of the fluid composition in a planarization process. By using the fluid compositions and methods of the present invention, planarization can be effectively performed without agglomeration of abrasive components which may lead to wafer defects. For example, in semiconductor-based device fabrication, such methods and fluid compositions enable higher yields to be realized in the fabrication of semiconductor-based integrated circuits due to the reduction in wafer defects, which often degrade electrical performance of an integrated circuit.

A typical planarization fluid composition of the invention, comprises an abrasive component that includes abrasive particles and a chemically interactive component as further described herein. Charged ion contaminants, particularly high valence metal ion species, are generally present in these planarization fluid compositions. For example, slurries such as Corundum-A and Corundum-B, available from Rodel Inc., Newark, Del., include a substantial quantity of, for example, $Zr^{+4}$. These charged ion contaminants destabilize the colloidal suspension of abrasive particles of the planarization composition and promote aggregations that can cause defects upon a wafer surface. Aggregations in planarization fluid compositions are the result of polar interactions between colloidal abrasive particles induced by the charged species which are present in the solution. The critical concentration of charged ions at which these aggregations occur decreases with valence as $1/z^6$, where z is valence of the charged species. This relationship is described by the Shulze-Hardy rule. Because of this $1/z^6$ dependence, high valence ions such as zirconium, $Zr^{4+}$, are particularly problematic. Thus, employing one or more crown ethers in a planarization fluid composition can be used to effectively isolate problematic charged ion contaminants, particularly high valence ion species, that are critical in controlling wafer defects, during a planarization process. Further, employing one or more crown ethers in a planarization fluid composition can be used to effectively remove charged ion contaminants, particularly high valence ion species, from a planarization fluid composition prior to use of the composition in planarization.

In addition, to preventing abrasive particle agglomeration, ion contamination (e.g., metal ion contamination) of wafers can be reduced by employing the present invention. For example, metal ions in the slurries which may bulk diffuse into a surface of a wafer may be reduced. Alternatively, metal ions which may diffuse down fracture paths of the wafer may be reduced.

Crown Ether Containing Planarization Fluid Composition

Crown ethers are a family of chemical compounds that have the unique ability to bind with and electrically isolate charged ions. As shown by compounds I and II below, crown ethers typically consist of a ring of repeating (—C—C—O) units. The oxygen atoms are located at the interior corners of the ring facets. Each of the oxygen atoms contains two lone pair of electrons that are directed toward the center of the ring like spokes on a wheel, creating an electron-rich zone in the center of the ring. Positively charged ions that are of suitable size are attracted to the center of the ring and trapped. By varying the number of repeating (—C—C—O) units, the size of the ring can be adjusted to complex or "fit" specific ions.

The stability of these complexes are found to depend on the number and geometrical disposition of the ether oxygen atoms and in particular on the size and shape of potential coordination polyhedra relative to the size of the cation. Typical examples of crown ethers are given in Table 2 as further described below, wherein the numerical prefix indicates the number of atoms in the heterocycle and the suffix the number of ether oxygens. The aromatic rings can be substituted, replaced by naphthalene residues, or reduced to cyclohexyl derivatives. The "hole size" for coordination depends on the number of atoms in the ring and is compared with conventional ionic radii (readily converted to ionic diameters) as shown in Table 1 below.

Crown ethers useful in the invention can be customized to selectively chelate ions of a specific size, or if desired, remove them entirely from the slurry as described further below. Crown ethers provide an electron-rich zone or area in the center of a ring structure, as shown below, that can chelate ions, such as metallic ions, of a specific size and charge. Thus, depending on the ion to be removed or isolated, a crown ether can be selected or prepared by sizing the crown ether to match a specific ion. Crown ethers, are typified by the formulas shown by compound I and II, however, crown ethers with as many as ten oxygens are known and several are commercially available.

In general, and as illustrated by compounds I and II, the formula "3n-crown-n" may be applied to prepare or select different size crown ethers. Typically, $n \geq 5$, and can be varied to change the size of the ring to match a specific ion to be isolated or removed from a fluid composition of the invention. Although this formula is useful as a guide, one skilled in the art will recognize that notable exceptions to this formula exist, for example, dibenzo-14-crown-4.

As systematic names for crown ethers are very unwieldy, a special nomenclature is used in which compound I and compound II are called, respectively, 15-crown-5 and dibenzo-18-crown-6. Crown ethers are very versatile and can be sized to selectively bind with specific ionic species. Other known chelation techniques are not so specific. The electron-rich area within a crown ether can also effectively isolate the ion and stabilize the slurry against the aggregations that can cause wafer defects.

The target ion species of which the present invention is beneficial in isolating, reducing, or removing, include but are not limited to, for example: the alkali metals such as sodium (Na), potassium (K) and Lithium (Li); alkaline earth metals such as magnesium (Mg) and calcium (Ca); heavy metals such as iron (Fe), nickel (Ni), and zinc (Zn); and any other metal ion contaminants including, for example, aluminum (Al), chromium (Cr), manganese (Mn), titanium (Ti), boron (B), zirconium (Zr), and copper (Cu), and any other metallic ion or ionic contaminant that would form a ligand forming complex with a crown ether of the invention.

A crown ether suitable in the invention is any crown ether soluble in an aromatic hydrocarbon, such as benzene, or other suitable organic solvent. Preferably, a pre-selected crown ether or combination of crown ethers are sized so as to reduce or isolate the amount of high valence metal ions, such as those that are known or suspected of destabilizing the colloidal suspension in the planarization fluid composition. Preferably, high valence ion species that can be targeted for isolation or removal in the present invention include all ions having a valence of +2, +3 or +4, such as those shown in Table 1, i.e., +2 ions include Ca, Cu, Fe, Be, Sr, Ba, Ra, Zn, Cd and Hg; +3 ions include Bi, Al, Sc, Y, La, Ga, In, Tl, Fe and Cr; +4 ions include C, Si, Ti, Zr, Ce, Ge, Sn and Pb. More preferably, the crown ether or combination thereof, is of sufficient size to remove +4 valence ion species, as such ions are most likely to cause agglomeration in planarization compositions. Even more preferably, the crown ether or ethers are of sufficient size to remove or isolate zirconium ($Zr^{+4}$) ions from a fluid composition yielding a fluid composition having a ($Zr^{+4}$) ion concentration in the range of about 100 parts per million (ppm) to about 1 part per billion (ppb), preferably about 1 ppm to about 10 ppb.

A specific crown ether or combination thereof may be selected, for example, by calculating the ionic diameter of the ion or ions to be removed or isolated, and selecting one or more crown ethers capable of complexing the ion. For example, Table 1 shows the radii for a variety of potentially contaminating ions in a fluid composition of the invention.

TABLE 1

Goldschmidt (G),[a] Pauling (P)[a], and Ladd (L)[a,b] Ionic Radii (Å)

| Ion | G | P | L | Ion | G | P | L |
|---|---|---|---|---|---|---|---|
| $H^-$ | 1.54 | 2.08 | 1.39 | $Pb^{2+}$ | 1.17 | 121 | — |
| $F^-$ | 1.33 | 1.36 | 1.19 | | | | |
| $Cl^-$ | 1.81 | 1.81 | 1.70 | $Mn^{2+}$ | 0.91 | 0.80 | 0.93 |
| $Br^-$ | 1.96 | 1.95 | 1.87 | $Fe^{2+}$ | 0.83 | 0.76 | 0.90 |
| $I^-$ | 2.20 | 2.16 | 2.12 | $Co^{2+}$ | 0.82 | 0.74 | 0.88 |
| | | | | $Ni^{2+}$ | 0.68 | 0.69 | — |
| $O^{2-}$ | 1.32 | 1.40 | 1.25 | $Cu^{2+}$ | 0.72 | - | |
| $S^{2-}$ | 1.74 | 1.84 | 1.70 | | | | |
| $Se^{2-}$ | 1.91 | 1.98 | 1.81 | $Bi^{3+}$ | 0.2 | 0.20 | — |
| $Te^{2-}$ | 2.11 | 2.21 | 1.97 | $Al^{3+}$ | 0.45 | 0.50 | — |
| | | | | $Sc^{3+}$ | 0.68 | 0.81 | — |
| $Li^+$ | 0.78 | 0.60 | 0.86 | $Y^{3+}$ | 0.90 | 0.93 | — |
| $Na^+$ | 0.98 | 0.95 | 1.12 | $La^{3+}$ | 1.04 | 1.15 | — |
| $K^+$ | 1.33 | 1.33 | 1.44 | $Ga^{3+}$ | 0.60 | 0.62 | — |
| $Rb^+$ | 1.49 | 1.48 | 1.58 | $In^{3+}$ | 0.81 | 0.81 | — |
| $Cs^+$ | 1.65 | 1.69 | 1.84 | $Tl^{3+}$ | 0.91 | 0.95 | — |
| $Cu^+$ | 0.95 | 0.96 | — | | | | |
| $Ag^+$ | 1.13 | 1.26 | 1.27 | $Fe^{3+}$ | 0.53 | — | — |
| $Au^+$ | — | 1.37 | — | $Cr^{3+}$ | 0.53 | — | |
| $Tl^+$ | 1.49 | 1.40 | 1.54 | | | | |
| $NH_4^+$ | — | 1.48 | 1.66 | $C^{4+}$ | 0.15 | 0.15 | — |
| | | | | $Si^{4+}$ | 0.38 | 0.41 | — |
| $Be^{2+}$ | 0.34 | 0.31 | — | $Ti^{4+}$ | 0.60 | 0.68 | — |
| $Mg^{2+}$ | 0.78 | 0.65 | 0.87 | $Zr^{4+}$ | 0.77 | 0.80 | — |
| $Ca^{2+}$ | 1.06 | 0.99 | 1.18 | $Ce^{4+}$ | 0.87 | 1.01 | — |
| $Sr^{2+}$ | 1.27 | 1.13 | 1.32 | $Ge^{4+}$ | 0.54 | 0.53 | — |
| $Ba^{2+}$ | 1.43 | 1.35 | 1.49 | $Sn^{4+}$ | 0.71 | 0.71 | — |
| $Ra^{2+}$ | — | 1.40 | 1.57 | $Pb^{4+}$ | 0.81 | 0.84 | — |
| $Zn^{2+}$ | 0.69 | 0.74 | — | | | | |
| $Cd^{2+}$ | 1.03 | .97 | 1.14 | | | | |
| $Hg^{2+}$ | 0.93 | 1.10 | — | | | | |

Once the diameter of a particular ion has been established, a crown ether having an appropriate or approximate "hole size" can be selected or prepared. Table 2 provides a comparison of some ionic diameters and crown ether "hole sizes."

TABLE 2

Comparison of ionic diameters and crown ether "hole sizes"

| Cation | Ionic Diameter/pm | Polyether ring | "Hole size"/pm |
|---|---|---|---|
| $Li^1$ | 152 | 14-crown-4 | 120–150 |
| $Na^1$ | 204 | 15-crown-5 | 170–220 |
| $K^1$ | 276 | 18-crown-6 | 260–320 |
| $Rb^1$ | 304 | 21-crown-7 | 340–430 |
| $Cs^1$ | 334 | — | — |

In a preferred embodiment, a $Zr^{+4}$ ion, based on ionic radii, can be expected to have an ionic diameter of between about 140–200 pm. Thus, a crown ether, such as dibenzo-14-crown-4 and/or benzo-15-crown-5, may be employed to isolate or remove $Zr^{+4}$ ions. However, other larger crown ethers, such as 18-crown-6 and 21-crown-7, may clearly also be effective.

Charged ion concentration reduction with respect to more than one type or species of metal ion by employing one or more crown ethers may be accomplished. However, the reduction of just one metal ion species by one crown ether is beneficial. Furthermore, although it is preferable to obtain a high percentage reduction for at least one metal or one metal species, even the slightest reduction of uncomplexed metal ions is beneficial.

The amount of a crown ether used in a planarization fluid composition of the invention is of an effective amount to reduce the concentration of undesirable metal ions in the fluid composition without impeding the polishing or planarization rate. Preferably, the crown ether is present in an amount of about 20 ppb to about 50,000 ppb to an amount less than about 5% by weight, more preferably to an amount less than about 1% by weight, based upon the total weight of the fluid composition.

The Planarization Process

Figures 1A, 1B, 2:
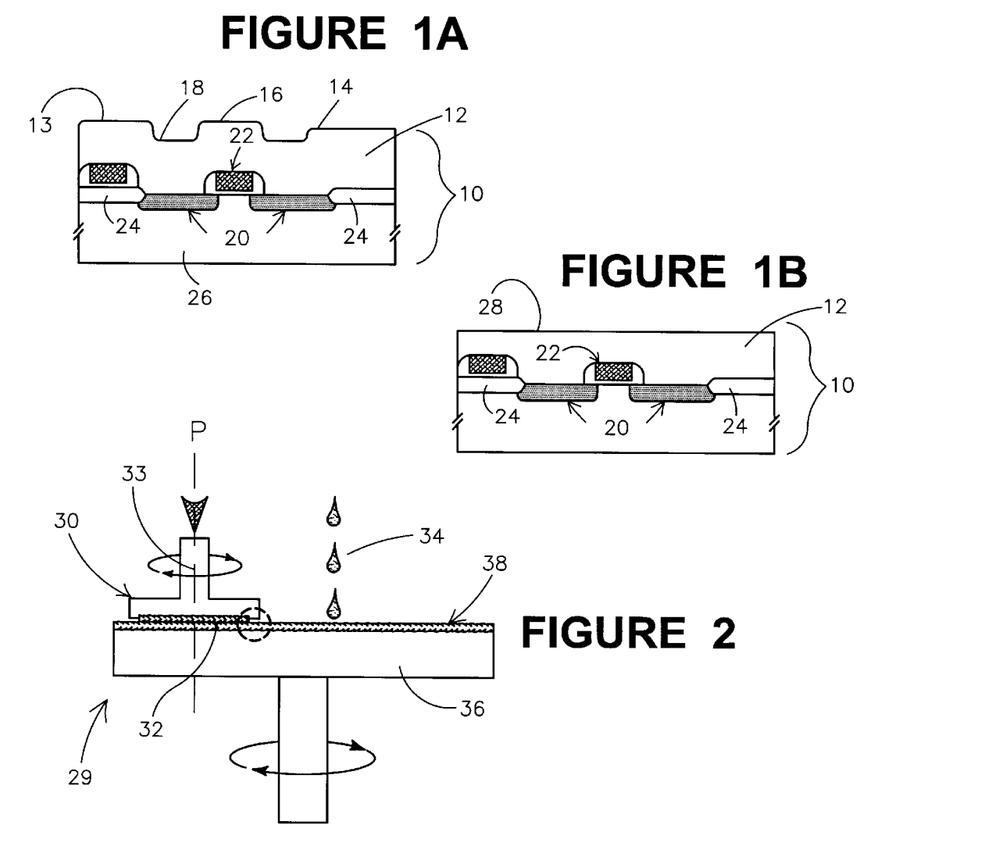
FIGS. 1A and 1B are cross-sectional illustrations of a part of a wafer before and after a planarization process has been performed in accordance with the present invention.
FIG. 2 is a general diagrammatical illustration of a chemical-mechanical polishing or planarization apparatus utilized in accordance with the present invention.

FIG. 1A illustrates a portion of a wafer 10 prior to planarization by chemical-mechanical polishing (CMP) in accordance with the present invention. The wafer portion 10 includes a substrate 26 having junctions 20 formed thereon. Isolation areas 24 are also formed on substrate 26 with polysilicon 22 deposited thereon. Over these elements formed on substrate 26, a film of borophosphosilicate glass (BPSG) 12 is formed, and, such as by reflow, the glass 12 conformably covers steps, fills gaps between polysilicon lines, and forms an upper surface having different heights such as at areas 14, 16, and 18. The nonplanar upper surface 13 of BPSG film 12 is the surface having non-uniformities which can be reduced or eliminated when subjected to planarization in accordance with the present invention.

FIG. 1A is shown only to illustrate a surface having nonuniformities in need of planarization for the fabrication of semiconductor devices. Other surfaces, including but not limited to other dielectrics, polysilicon, oxide filled trenches, such as those employing $CVD-SiO_2$ shallow trench isolation (STI), various metal films, other doped oxides, spin on glasses, or any other fabricated surface which may require planarization as is known to one skilled in the art may benefit from the present invention. Therefore, the present invention is not limited to the planarization of any particular surface, but is limited only in accordance with the invention as described in the accompanying claims.

FIG. 1B illustrates the wafer portion 10 shown in FIG. 1A after the upper surface 13 of the BPSG film 12 has been planarized in accordance with the present invention. The resulting wafer 10 includes an upper surface 28 planarized or polished such that the thickness of the wafer 10 is substantially uniform across the entire wafer 10 and free of defects, e.g., scratches. As will be described further below, the present invention provides for a uniformly thick wafer having a reduced number of wafer defects and reduced metal ion contamination.

The present invention is not limited to use with nonplanar surfaces, such as that shown in FIG. 1A. The present invention is also beneficial for use with substantially planar surfaces such as the surface 28 shown in FIG. 1B. For example, the slurry and method of planarization in accordance with the present invention is beneficial during the whole planarization process. As such, the benefits are applicable to both nonplanar and planar surfaces and furthermore through the entire planarization process.

FIG. 2 is a diagrammatical illustration showing one embodiment of a CMP process for planarization of surfaces of semiconductor wafers in accordance with the present invention. As shown in FIG. 2, the present invention utilizes a planarization assembly 29 such as Model 372 or Model 472 available from IPEC/Westech. Other planarization assemblies or units for performing planarization methods are readily available and are clearly contemplated by the scope of the present invention as described in the accompanying claims. For example, the planarization process may be performed with the apparatus described in U.S. Pat. No. 5,421,729, entitled "Apparatus For Planarizing Semiconductor Wafers, and a Polishing Pad for a Planarization Apparatus" and herein incorporated by reference; U.S. Pat. No. 4,193,226 entitled "Polishing Apparatus" and herein incorporated by reference; U.S. Pat. No. 4,811,522 entitled "Counterbalanced Polishing Apparatus" and herein incorporated by reference; and any other planarization assembly as known to those skilled in the art. Various other embodiments of planarization assemblies are known and available for use with the present invention. For example, some planarization units do not use rotating platens and rotating wafer holders. The present invention is inclusive of all planarization units for which the present invention provides benefit.

Figure 3:
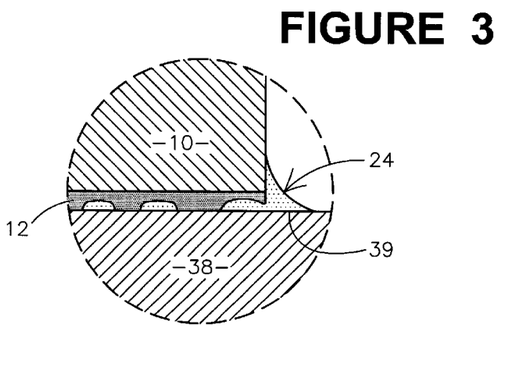
FIG. 3 is an enlarged view of a portion of the dashed circle area of FIG. 2.

The general illustrative planarization assembly, as shown in FIG. 2, for performing planarization in accordance with the present invention, includes a rotating wafer holder 30 that holds wafer 32 of which wafer portion 10 is a part thereof. A fluid composition 34 in accordance with the present invention is introduced on a polishing pad 38. The polishing pad 38 is located on a rotating table platen 36. The polishing pad 38 is applied to the surface 12 of wafer 10 in the presence of the fluid composition 34 at a certain pressure to perform the planarization as is shown in the detail drawing of FIG. 3. The pressure applied is represented in FIG. 2 by the arrow mark "P"; this pressure P represents both down force pressure and backside pressure applied per a planarization assembly, such as an assembly available from IPEC/Westech. The rotating elements 30, 36 are rotated and moved by motors or drive means (not shown) as is readily known to those skilled in the art.

Wafer holder 30 rotates wafer 32 at a selected velocity about an axis 33 and moves wafer 32 under controlled pressure P across pad 38. The wafer 32 contacts the pad 38 as it is moved. The area of the pad 38 which comes into contact with the surface 12 of the wafer 32 varies as the wafer 32 is moved in a predetermined pattern as is known to those skilled in the art.

A chemical supply system (not shown) introduces a fluid composition 34 atop the pad 38 at a specified flow rate. The fluid composition 34 may be introduced at various locations about the pad without affecting the benefits of the present invention. For example, the fluid composition 34 may be introduced from above the pad 38, such as by drip, spray, or other dispensing means and further may be introduced from beside the rotating table 36 by spraying or other dispensing means.

The rotating table 36 is rotated at a selected velocity and is rotated in the same direction as the wafer holder 30. The surface 12 of the wafer 32 is held in juxtaposition relative to the pad 38 so that the pad 38 can planarize or polish surface 12. The fluid composition and the pad pressure primarily determine the polishing rate or rate of removal of the surface material.

The benefits of using a fluid composition comprising a crown ether are not affected by the type or material of the polishing pad utilized. For example, the fluid composition may be utilized with any known and appropriate polishing pad as would be known to one skilled in the art because the choice of pads is application dependant. For example, suitable pads may include pads such as Model No. IC 1000, Model No. IC 60 and Polytech pads, all available from Rodel, Inc., Newark, Del. The polishing pad may include one or more pads; may be of specific shape, i.e. circular, oval, or rectangular; may be of a nonuniform shape; and may be of any particular hardness depending on the particular application. Further, as described above, the pads may be pads that include an abrasive component at a surface thereof for planarization.

To alleviate agglomeration of abrasive during the planarization process, the present invention may perform the planarization process in the presence of a planarization fluid composition (e.g., slurry) 34 containing one or more crown ether to isolate one or more species of charged ion contaminants. Alternatively, as further described below, a planarized fluid composition can be pre-treated with one or more crown ethers to remove one or more charged ion contaminants suspected to be or known to be present in the fluid composition.

The planarization fluid composition 34 may generally include an abrasive component and a component that chemically interacts with the surface 12. For example, a typical oxide polishing slurry may consist of a colloidal suspension of oxide particles, with an average size of, for example 120 nm, in an alkali solution having a pH greater than or equal to 9. Ceria ($CeO_2$) suspensions may also be used when appropriate, particularly where large amounts of $SiO_2$ must be removed. Ceria acts as both the chemical and mechanical agent in the slurry. Other abrasive components of the slurry component may include, but are not limited to, alumina ($Al_3O_2$), silica, zirconium oxide ($ZrO_2$), titania ($TiO_2$), or any other abrasive used in conventional planarization slurries as is known to one skilled in the art. Several slurry solutions presently available include: Corundum-A (Rodel Inc., Newark, Del.), Corundum-B (Rodel Inc., Newark, Del.), Granite 14, ILD1300 (i.e., an aqueous fumed silica slurry including amorphous silica and ammonium hydroxide, available from Rodel, Inc., Newark, Del.) and SC-1 (i.e., a colloidal fumed silica aqueous slurry including amorphous silicon dioxide, DI water, and potassium hydroxide, available from Cabot Corp. Tuscola, Ill. under the trade designation CAB-O-SPERSE SC-1).

General characteristics of suitable conventional slurry components utilized in conjunction with the present invention include that the hardness of the polishing particles or abrasive component should be about the same hardness as the hardness of the film being polished to avoid damaging the film. In addition, the particles should be uniform and the solution free of metallic contaminants. Further, for example, conventional planarization slurries having a pH greater than about 9 are used for oxide polishing processes and those less than a pH of about 4 are used in polishing processes of, for example, tungsten. The conventional slurry used is dependant upon the type of surface being polished.

The amount of a crown ether employed in a planarization fluid composition and used during planarization according to the present invention is an effective amount necessary to reduce the effect of, for example, particular charged ion contaminants in the fluid compositions and surfaces with which the fluid compositions are in contact. Concentrations of a particular crown ether or crown ethers used in a planarization fluid composition of the invention can constitute about 1–70% of the fluid compositions in which they are used. Preferably, a crown ether is present in the composition in an amount of less than about 50% by weight. More preferably, the crown ether is present in the fluid composition in an amount of less than about 10% by weight.

Figure 5:
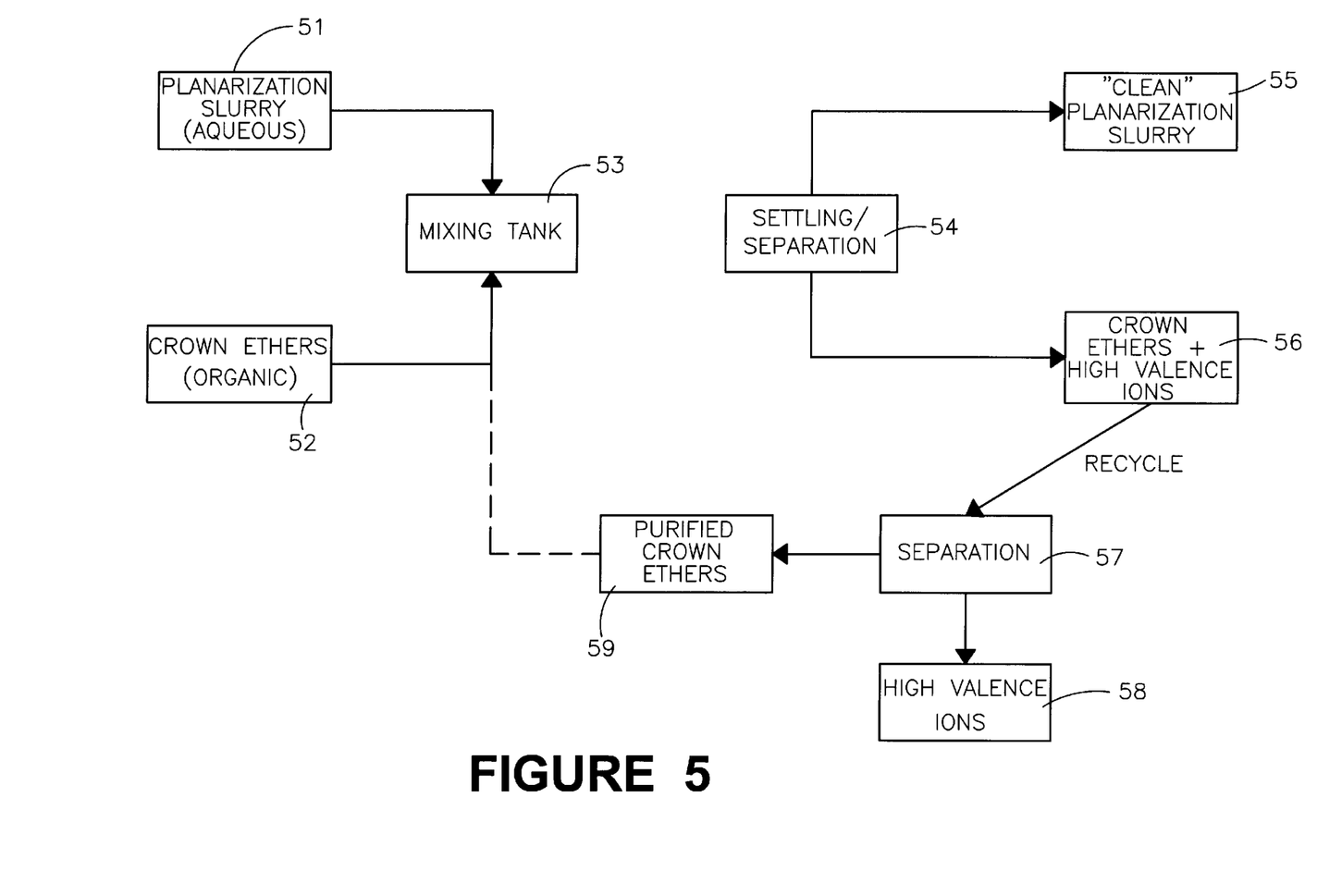
FIG. 5 is a block diagram of the preparation, i.e., pre-treatment of a planarization slurry employing a crown ether or a combination of crown ethers in an organic solvent layer.

Preparation of a pre-treated planarization fluid composition that can be employed in a planarization process of the invention is schematically illustrated in FIG. 5. Generally, a planarization slurry 51 suspected or known to contain charged ion contaminants, particularly unwanted contaminating high valence ions, can be pre-treated with one or more crown ethers. Depending on the ion or ions to be removed from the slurry, a preparation of suitable crown ethers in a suitable organic solvent 52 can be prepared and mixed in a suitable container 53 with the planarization slurry such that the mixture can be agitated. By subsequent settling and separation steps 54, a "cleaned" aqueous planarization slurry 55 can be obtained and a separate organic layer containing the crown ethers and isolated ions 56 can be removed. Significantly, the crown ether organic layer sequestering the contaminating high valence ions, can be recycled by separation techniques 57 known in the art to yield purified crown ethers contained within an organic layer 59 and removed high valence ions 58. This crown ether containing organic layer 59 can then be re-employed in further purification of other planarization slurries 51, which along with the purified crown ether containing organic layer 59 is provided back to the mixing tank 53. The final cleaned aqueous planarization fluid composition 55 may be employed in a planarization method of the invention.

Planarization in Shallow Trench Isolation

Although local oxidation of silicon (LOCOS) has long been the conventional process for fabricating isolation, and has the advantage of being both relatively inexpensive and capable of providing isolation over wide areas of a chip. LOCOS has several disadvantages, such as the formation of a "bird's beak" that increases the horizontal space of the isolation, reducing the density of devices on a chip.

Because of its more vertical sidewalls and more planar surface, trench isolation provides significant advantage over LOCOS in the quest for providing a high density of integrated circuits. Trench isolation schemes are therefore finding increasing use in semiconductor processing. However, because of planarization difficulties, trench isolation is complex and expensive to process.

Figure 4A:
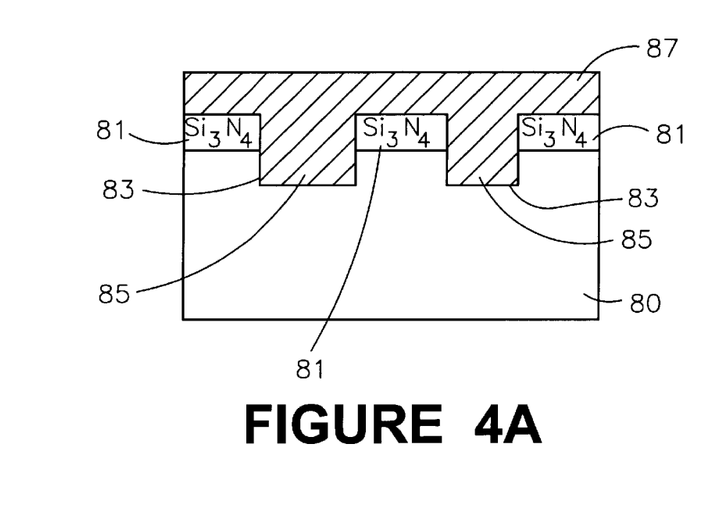
FIGS. 4A–4C are general diagrammatical illustrations showing use of the present invention in a shallow trench isolation process.

Trench isolation process complexity is evident from a general brief description of the conventional shallow trench isolation (STI) process. First, thick silicon nitride is deposited on a thin silicon dioxide pad on the silicon substrate 80. Then, using conventional photolithography, the silicon nitride 81 is patterned as shown in FIG. 4A defining the isolation areas 83 where STI is desired. Next, the substrate 80 is etched, using, for example, a reactive ion etch (RIE) process, to form shallow trenches 85. A thin layer of silicon dioxide is then grown and silicon dioxide 87 is deposited, filling the shallow trenches and covering the patterned silicon nitride 81.

As shown in FIG. 4A, the silicon dioxide 87 has a surface that must be planarized. The planarization process is quite complex because the oxide deposition is usually conformal, and therefor narrow areas of isolation may be at a higher level than wide areas of isolation. Additionally, wide areas of isolation polish much more quickly than narrow areas, a problem known as dishing may occur. Dishing is a problem, first because oxide in these large areas of STI is thinner than in narrow areas, and second because in regions having a low density of devices, the silicon nitride polish stop layer 81 over small, isolated active area regions may be completely polished off, and then the active area may get polished down, introducing potential damage to the substrate 80.

However, at least the slurries available from Rodel (Newark, Del.) and sold under the trade designation Corundum A and Corundum B, effectively stop planarizing when the silicon nitride stop layer is reached. However, such slurries contain a large amount of high valence +4 charged ion contaminants, e.g., $Zr^{+4}$, which leads to abrasive particle agglomeration and wafer scratching. To overcome these difficulties, utilization of a fluid composition, such as Corundum A and Corundum B, pre-treated with one or more crown ethers as described with reference to FIG. 5 may be employed. If a combination of fluid compositions are to be employed, e.g., Corundum A and Corundum B, each fluid composition is preferably separately pre-treated, as described above and as set forth in FIG. 5, before the fluid compositions are combined. More preferably, Corundum A is pre-treated and then combined with Corundum B, whether Corundum B is pre-treated or not pre-treated.

Figure 4B:
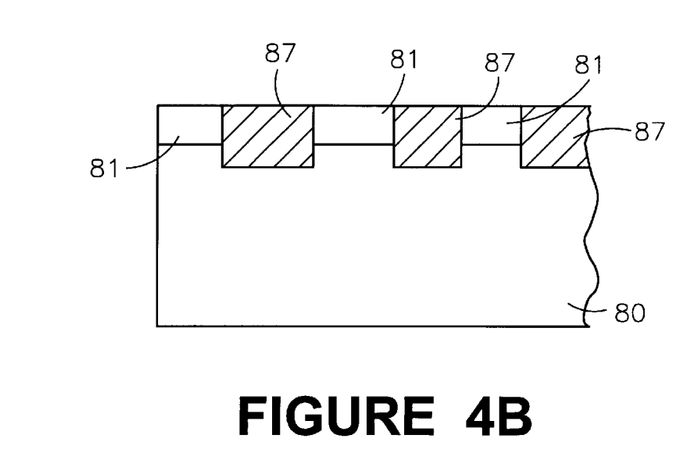

Alternatively, a crown ether containing fluid composition may be utilized during the planarization process. A fluid composition pre-treated with or incorporating one or more crown ethers during a planarization process, as described above, can effectively eliminate high valence ion contaminants and therefore prevent or reduce the agglomeration of abrasive particles in a planarization slurry as agglomeration of these abrasive particles may pit or scratch either or both the silicon oxide ($SiO_2$) 87 or silicon nitride ($Si_3N_4$) 81 surfaces. As such, by employing the crown ether fluid compositions of the present invention, greater control is provided in stopping the planarization process on the silicon nitride $Si_3N_4$ while preventing such scratching.

Figure 4C:
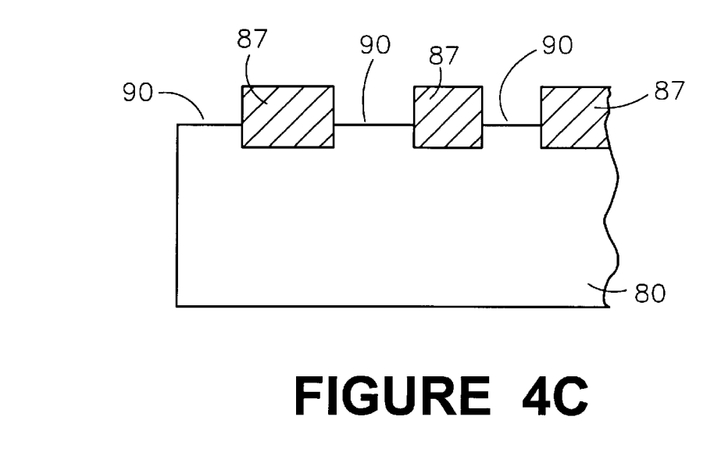

The STI structure resulting after the planarization process is shown in FIG. 4C. After the planarization process, the silicon nitride 81 is removed yielding defined active areas 90 between oxide regions 87.

All publications, patents and patent documents are incorporated by reference herein, as though individually incorporated by reference. Although the invention has been described with particular reference to a preferred embodiment thereof, variations and modifications of the present invention can be made within a contemplated scope of the following claims as is readily known to one skilled in the art.

What is claimed is:

1. A planarization method comprising:
   providing a wafer having a wafer surface;
   positioning a pad for contact with the wafer surface;
   planarizing the wafer surface using the pad and a fluid composition, wherein the fluid composition comprises a planarization slurry including:
   an abrasive component,
   a chemically interactive component that interacts with the surface of the wafer during planarization, and
   an effective amount of at least one crown ether capable of isolating at least one charged ion contaminant specie in the planarization slurry.

2. The planarization method according to claim 1, wherein the at least one crown ether has the formula benzo-3n-crown-n or dibenzo-3n-crown-n, where n is a positive whole integer.

3. The planarization method according to claim 1, wherein the effective amount is less than about 0.5% by weight of the total weight of the fluid composition.

4. The planarization method according to claim 1, wherein the effective amount is less than about 0.1% by weight of the total weight of the fluid composition.

5. The planarization method of claim 1, wherein the at least one crown ether is capable of isolating a charged ion contaminant specie having a valence of +2 or more.

6. The planarization method of claim 5, wherein the charged ion contaminant specie is $Zr^{+4}$.

7. The planarization method of claim 6, wherein the at least one crown ether is dibenzo-14-crown-4 ether, benzo-15-crown-5 ether, dibenzo-18-crown-6 ether or benzo-21-crown-7 ether, or a combination thereof.

8. The planarization slurry of claim 7 wherein the charged ion contaminant specie is $Zr^{+4}$.

9. The fluid composition according to claim 8, wherein the at least one crown ether is dibenzo-14-crown-4 ether, benzo-15-crown-5 ether, dibenzo-18-crown-6 ether or benzo-21-crown-7 ether, or a combination thereof.

10. A planarization method of claim 8, wherein the crown ether is dibenzo-14-crown-4 ether, benzo-15-crown-5 ether, dibenzo-18-crown-6 ether or benzo-21- crown-7 ether, or a combination thereof.

11. The planarization method of claim 10, where the crown ether is of the formula benzo-3n-crown-n or dibenzo-3n-crown-n, wherein n is a positive whole integer.

12. The method of claim 10 wherein the crown ether is dibenzo-14-crown-4 ether, benzo-15-crown-5 ether, dibenzo-18-crown-6 ether or benzo-21-crown-7 ether, or a combination thereof.

13. The planarization method of claim 10, wherein the at least one charged ion contaminant specie removed has a valence of +2 or more.

14. The planarization method of claim 13, wherein the at least on charged ion contaminant specie removed has a valence of +3 or more.

15. The planarization method of claim 14, wherein the at least one charged ion contaminant specie removed has a valence of +4.

16. The planarization method of claim 15, wherein the removed charged ion contaminant specie is $Zr^{+4}$.

17. A method for removing a charged ion contaminant specie from a planarization slurry comprising:
combining an aqueous planarization slurry and at least one crown ether in an organic solvent to form a mixture;
agitating the mixture and allowing an aqueous layer and an organic layer to form wherein the organic layer isolates at least one charged ion contaminant specie; and
separating the organic layer from the aqueous layer to yield a planarization slurry having a reduced concentration of the at least one charged ion contaminant specie.

18. The method of claim 17, further comprising extracting the at least one charged ion contaminant specie from the organic layer to yield an organic solvent having at least one crown ether that is essentially free from charged ion contaminants.

19. The method of claim 17, wherein the crown ether is of the formula benzo-3n-crown-n or dibenzo-3n-crown-n, where n is a positive whole integer.

20. The method of claim 17, wherein the crown ether is dibenzo-14-crown-4 ether, benzo-15-crown-5 ether, dibenzo-18-crown-6 ether or benzo-21-crown-7 ether, or a combination thereof.

21. The method of claim 17, wherein the at least one charged ion contaminant specie has a valence of +2 or more.

22. The method of claim 21, wherein the at least one charged ion contaminant specie is $Zr^{+4}$.

23. The method of claim 22, wherein the at least one charged ion contaminant specie has a valence of +4.

24. The method of claim 23 wherein the at least one charged ion removed contaminant specie is $Zr^{+4}$.

25. An isolation method comprising:
forming a shallow trench isolation structure having an oxide surface and including a planarization stop layer formed of silicon nitride; and
planarizing the oxide surface using a fluid composition, wherein the fluid composition comprises:
a planarization slurry including an abrasive component and a chemically interactive component that interacts with the surface during planarization; and
an effective amount of at least one crown ether, wherein the crown ether is capable of isolating at least one charged ion contaminant specie.

26. The method of claim 25, wherein the crown ether is of the formula benzo-3n-crown-n or dibenzo-3n-crown-n, where n is a positive whole integer.

27. The method of claim 25, wherein the crown ether is dibenzo-14-crown-4 ether, benzo-15-crown-5 ether, dibenzo-18-crown-6 ether, dibenzo-21-crown-7 ether or a combination thereof.

28. The isolation method of claim 25, wherein the crown ether is capable of isolating $Zr^{+4}$.

29. The method of claim 23, wherein the effective amount of the crown ether in the fluid composition is of an amount less than about 0.5% by weight of the total weight of the fluid composition.

30. The method of claim 25, wherein the effective amount of the crown ether in the fluid composition is of an amount less than about 0.1% by weight of the total weight of the fluid composition.

31. The method of claim 25, wherein the at least one crown ether is capable of isolating at least one charged ion contaminant specie having a valence of +2 or more.

32. The method of claim 31, wherein the at least one crown ether is capable of isolating at least one charged ion contaminant specie having a valence of +3 or more.

33. The planarization method according to claim 32, wherein the at least one crown ether is dibenzo-14-crown-4 ether, benzo-15-crown-5 ether, dibenzo-18-crown-6 ether or benzo-21-crown-7 ether, or a combination thereof.

34. An isolation method comprising:
forming a shallow trench isolation structure having an oxide surface and including a planarization stop layer formed of silicon nitride; and
planarizing the oxide surface using a fluid composition including an abrasive component and a chemically interactive component that interacts with the surface, wherein the fluid composition has a $Zr^{+4}$ content of less than 1 ppm, and further wherein the planarization effectively stops on the planarization stop layer formed of silicon nitride.

35. A planarization method comprising:
providing a wafer having a wafer surface;
positioning a pad for contact with the wafer surface;
planarizing the wafer surface using the pad and a fluid composition, wherein the fluid composition comprises a planarization slurry including:
an abrasive component,
a chemically interactive component that interacts with the surface of the wafer during planarization, and an effective amount of at least one crown ether, the crown ether selected to isolate $Zr^{+4}$ within the planarization slurry; and isolating $Zr^{+4}$ within the planarization slurry, resulting in a $Zr^{+4}$ content within the planarization slurry of less than about 1 ppm.

36. The fluid composition according to claim 35, wherein the at least one crown ether is dibenzo-14-crown-4 ether, benzo-15-crown-5 ether, dibenzo-18-crown-6 ether or benzo-21-crown-7 ether, or a combination thereof.

37. The planarization method according to claim 35, wherein the at least one crown ether is present within the planarization slurry in an amount of about 20 ppb to about 50,000 ppb.

* * * * *

UNITED STATES PATENT AND TRADEMARK OFFICE
CERTIFICATE OF CORRECTION

PATENT NO.   : 6,468,909 B1
DATED        : October 22, 2002
INVENTOR(S)  : Marshall It is certified that error appears in the above-identified patent and that said Letters Patent is hereby corrected as shown below:

Column 12,
Lines 55-56, please delete "at least one charged ion contaminant specie in the planarization slurry" and insert in its place -- a charged ion contaminant specie having a valence of +3 or more --;

Column 13,
Line 3, please delete "+2 or more" and insert in its place -- +4 --;
Lines 10-11, please delete claim 8 in its entirety;
Lines 12-15, please delete claim 9 in its entirety;
Lines 16-19, please delete "A planarization method of claim 8, wherein the crown ether is dibenzo-14-crown-4 ether, benzo-15-crown-5 ether, dibenzo-18-crown-6 ether or benzo-21-crown-7 ether, or a combination thereof."
and insert in its place
-- A planarization method comprising:
    preparing a planarization fluid composition for use during planarization of a wafer, wherein the preparation includes removing at least one charged ion contaminant specie from the planarization fluid composition using at least one crown ether; and
    planarizing the wafer using at least the prepared fluid composition. --;

Line 23, please insert -- planarization -- after "The";
Line 23, please insert -- , -- after "claim 10";
Line 65, please delete "is $Zr^{+4}$" and insert in its place -- has a valence of +3 or more --;

Column 14,
Line 1, please insert -- , -- after "23";
Line 2, please delete "removed";
Line 13, please insert -- at least one -- before "crown ether";
Line 14, after "specie" insert -- having a valence of +2 or more --;
Line 20, please delete "dibenzo-21-crown-7" and insert -- benzo-21-crown-7 --;
Line 24, please delete "23" and insert in its place -- 25 --;
Line 28, please delete "25" and insert in its place -- 29 --;
Line 34, please delete "+2 or more" and insert in its place -- +3 or more --;
Line 37, please delete "+3 or more" and insert in its place -- +4 --;
Lines 42-45, please delete claim 33 in its entirety;

UNITED STATES PATENT AND TRADEMARK OFFICE
CERTIFICATE OF CORRECTION

PATENT NO.   : 6,468,909 B1
DATED        : October 22, 2002
INVENTOR(S)  : Marshall It is certified that error appears in the above-identified patent and that said Letters Patent is hereby corrected as shown below:

<u>Column 15,</u>
Line 7, please delete "fluid composition" and insert in its place
-- planarization method --.

Signed and Sealed this

Nineteenth Day of August, 2003

JAMES E. ROGAN
*Director of the United States Patent and Trademark Office*